United States Patent [19]

Sato et al.

[11] Patent Number: 4,912,395
[45] Date of Patent: Mar. 27, 1990

[54] TESTABLE LSI DEVICE INCORPORATING LATCH/SHIFT REGISTERS AND METHOD OF TESTING THE SAME

[75] Inventors: Yoshio Sato, Hiratsuka; Toshifumi Ishii, Hadano; Yasushi Kohno, Hadano, all of Japan

[73] Assignees: Hitachi, Ltd., Tokyo; Hitachi Computer Engineering, Kanagawa, both of Japan

[21] Appl. No.: 211,043

[22] Filed: Jun. 24, 1988

[30] Foreign Application Priority Data

Jun. 26, 1987 [JP] Japan .................................. 62-159351

[51] Int. Cl.$^4$ ............................................... G01R 31/28
[52] U.S. Cl. ..................................... 571/21.2; 371/15; 371/25.1; 371/22.3
[58] Field of Search .................. 324/73 R, 73 AT; 371/15, 25

[56] References Cited

U.S. PATENT DOCUMENTS 4,441,075  4/1984  McMahon ........................ 324/73 R
4,710,930  12/1987  Hatayama et al. .................... 371/25

FOREIGN PATENT DOCUMENTS 62-34244  2/1987  Japan .

*Primary Examiner*—Ernest F. Karlsen
*Attorney, Agent, or Firm*—Antonelli, Terry & Wands

[57] ABSTRACT

A testable LSI chip incorporating memory blocks, such as RAM and ROM, and random logic circuitry, and a testing method thereof are disclosed. A front-stage peripheral logic circuit block and rear-stage peripheral logic circuit block connected to the input and output modes of a memory block are provided on their output side and input side, respectively, with the flip-flops in correspondence to the input and output nodes of the memory block. The flip-flops on the output side and flip-flops on the input side are each connected to form a shift register. In testing the front peripheral logic block, the test result is latched in the flip-flops on the output side and then the contents are shifted out for reading. In testing the rear-stage peripheral logic circuit block, a bit pattern for testing is shifted-in and latched in the flip-flops on the input side and then supplied to the rear-stage peripheral logic circuit block under test. The front and rear-stage peripheral logic circuit blocks are tested independently of the memory block.

4 Claims, 4 Drawing Sheets

TESTABLE LSI DEVICE INCORPORATING LATCH/SHIFT REGISTERS AND METHOD OF TESTING THE SAME

BACKGROUND OF THE INVENTION

This invention relates to an externally testable LSI device incorporating circuits for testing, such as latch/shift registers, and a method of testing the LSI chip. Particularly, the invention relates to an LSI chip incorporating functional blocks such as RAM, ROM and peripheral logic circuits capable of being tested externally, and a method of testing the functional blocks of LSI through the test pattern generation.

Conventional LSI devices incorporating memory blocks such as RAM and ROM together with random logic circuits have their contents of memory blocks varied depending on the states of flip-flops in the periphery of the memory blocks. Therefore, it is difficult to make access to the memory blocks from the LSI edge node (bonding pads) for setting or reading out their contents. On this account, in diagnosing an LSI chip incorporating memory blocks, a test pattern is prepared exclusive of the memory block and uncertainty value "X" is inserted in the output signals of the memory blocks. A diagnostic technique of this kind is disclosed in JP-A-No. 62-34244 (published on Feb. 14, 1987) by the same inventors of the present invention.

The above-mentioned conventional technique, in which uncertainty value "X" is inserted in the output signals of memory blocks in conducting a diagnosis, makes it infeasible to detect defects in the peripheral logic circuits which are the signal propagation path for the memory blocks, resulting in a lower defect detection rate for the whole LSI chip inclusive of the memory block peripheral logic circuits.

The same problem arises in testing comprehensive LSI chips in which various functional blocks are included. Namely, it is difficult to test a specific block such as a memory block independently of other blocks in mutual connection.

SUMMARY OF THE INVENTION

An object of this invention is to provide a circuit arrangement of LSI chips, in which various functional blocks exist in mutual connection, suitable for testing each block externally independently of other blocks, and to provide a method of testing the LSI chips.

Another object of this invention is to provide a method of testing LSI chips having functional blocks such as memory blocks that is capable of easily setting and reading out contents of the memory blocks on the LSI edge nodes, thereby enabling the defect detection for the peripheral logic blocks associated with the memory block, and to provide a circuit arrangement of LSI chips suitable for the test.

A feature of this invention is that an LSI device incorporating various functional blocks comprises latch/shift components including latches, e.g., flipflops, with associated signal shift function provided for the input/output signal lines of each block accessible for setting and reading out test values from the LSI edge nodes and in connection in parallel to connecting nodes between blocks, test value set/read signal lines connected to the input and output for the shift circuits which are serial connections of the latch/shift components at the input and output of each block, clock control lines for switching the latch components to have a latch function or shift function, and a mode signal line for switching the latch components to have the test mode or normal mode. Input function block and output function block in the peripheral circuit in direct connection with the LSI edge nodes are provided with known scanning circuit for testing on their input side or output side, respectively. The above signal lines constitute part of the LSI edge nodes.

Another feature of this invention is that a memory block such as ROM or RAM is provided on its input and output node sides with flip-flops, each group being connected to perform a latch function and shift-register function and accessible from the LSI edge nodes for setting and reading out the contents, and the memory block peripheral logic circuits are tested independently of the memory block. The flip-flops provided for the memory block operate as shift registers or latch registers depending on the state of the operation switching signal. In the diagnostics mode of LSI, the test result signals from a peripheral logic circuit of the memory block on its write side are held in the input node flip-flops, which then operate to shift out the signals to an LSI edge node and to the outside. The test signal to a peripheral logic circuit of the memory block at its read side carrying values of test pattern provided on the LSI edge nodes are set in the output node flip-flops by being shifted, and the signals are delivered to the peripheral logic circuit of the memory block on its read side.

DESCRIPTION OF THE PREFERRED EMBODIMENTS

Embodiments of this invention will be described in detail with reference to the drawings.

Figure 1:
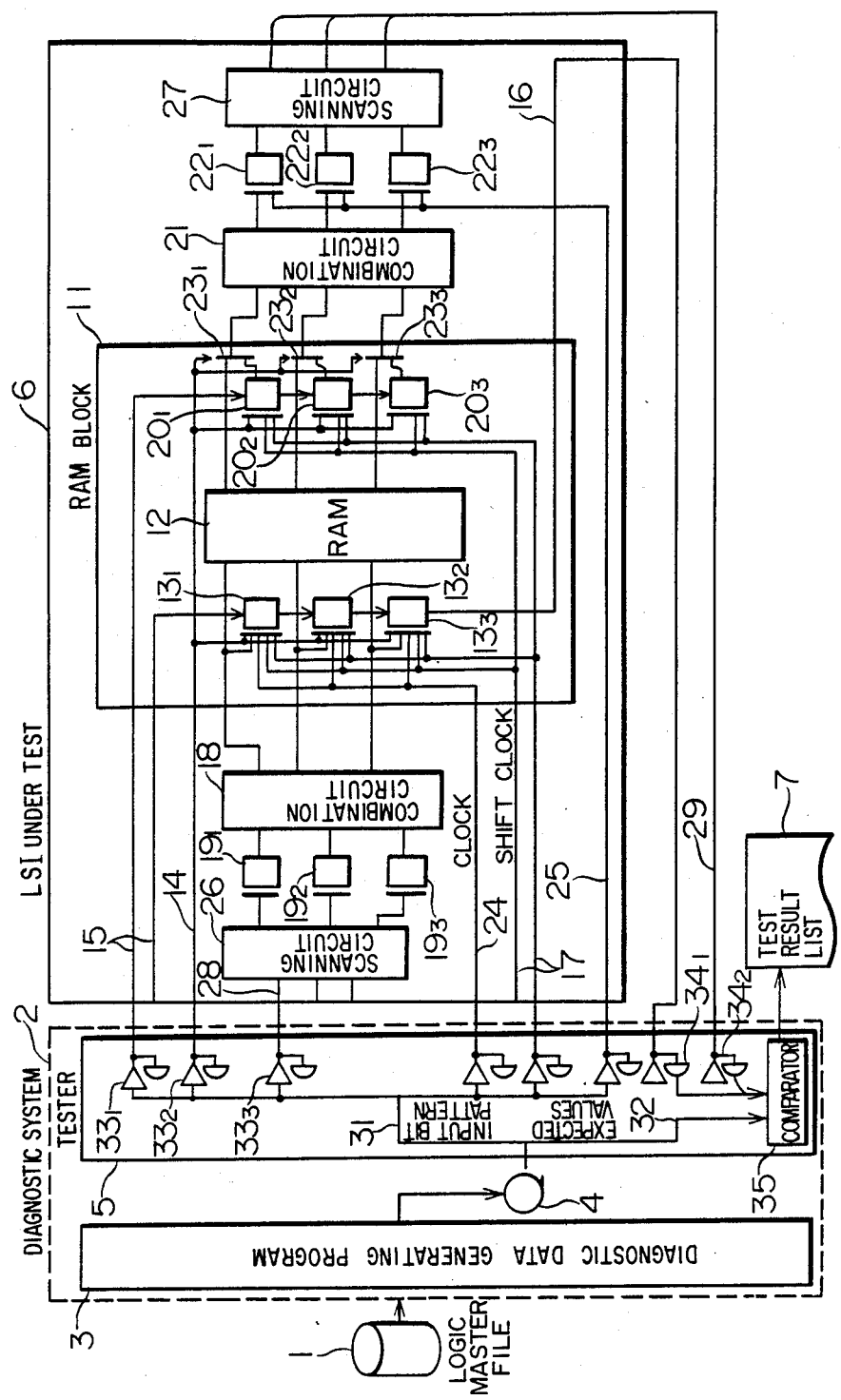
FIG. 1 is a schematic diagram of the LSI device embodying the present invention.

FIG. 1 shows the connection of the LSI diagnostic system and an LSI chip under test incorporating RAM. Indicated by 1 is a logic master file, 2 is the diagnostic system, 6 is an LSI chip under test, and 7 is a test result list. The diagnostic system 2 is made up of a diagnostic data generation program 3, a diagnostic data storage 4, and a tester 5. The tester 5 includes drivers $33_1$, $33_2$, ..., $33_n$, receives $34_1$, $34_2$, ..., $34_n$, and a comparator 35.

The LSI chip 6 incorporates a RAM block 11, peripheral flip-flops $19_1$, $19_2$ and so on and $22_1$, $22_2$ and so on, a combination circuit 18, and scanning circuits 26 and 27 which are activated in a test mode. The RAM block 11 consists of a RAM array 12 and flip-flops $13_1$–$13_3$ and $20_1$–$20_3$ provided in correspondence to the input/output nodes. A signal line 14 is used to select the test mode and switch the latch/shift function of the flip-flops. Selectors $23_1$–$23_3$ select the outputs of flip-flops $20_1$–$20_3$ when the signal line 14 indicates a latch mode.

The following describes the test operation by the arrangement of FIG. 1 by taking an example of detecting a failure in the combination circuit 18 located in the front stage of the RAM block. Diagnostic data created by the program 3 is entered to the tester 5, and the input bit pattern and its output expected values are applied to the input pattern signal line 31 and output expected signal line 32. The input bit pattern on the signal line 31 is supplied to the LSI chip 6 under test by way of the drivers 33 and associated signal lines by the treatment of the test value setting signal 15, operation switching signal 14, etc.

The test operation in the LSI 6 begins with the setting of values in the front-stage flip-flops 19 by way of a scan-in data line 28 and scanning circuit 26. Next, the operation switching signal 14 is activated to initialize the flip-flops $13_1$–$13_3$. The contents of the front-stage flip-flops $19_1$–$19_3$ are propagated in the front-stage combination circuit 18. With the operation switching signal 14 being LATCH mode, the clock signal 24 is activated so that the output of the combination circuit 18 resulting from the test bit pattern is held in the flip-flops $13_1$–$13_3$. Next, the operation switching signal 14 is returned to SHIFT mode, to operate the flip-flops $13_1$–$13_3$ as a shift register, so that the contents of the flip-flops $13_1$–$13_3$ are introduced to the tester by way of the read signal line 16 and receiver 34. Finally, the output expectation values on the signal line 32 and the contents of flip-flops $13_1$–$13_3$ on the signal line 16 are compared by the comparator 35, which then produces the test result on the list 7.

These are the test operation for the combination circuit 18 which is a peripheral logic circuit of the RAM. The rear-stage combination circuit 21 can be tested in the same procedure as described above. For simplicity purposes, the address lines of RAM are not shown in the Figure.

Figure 2:
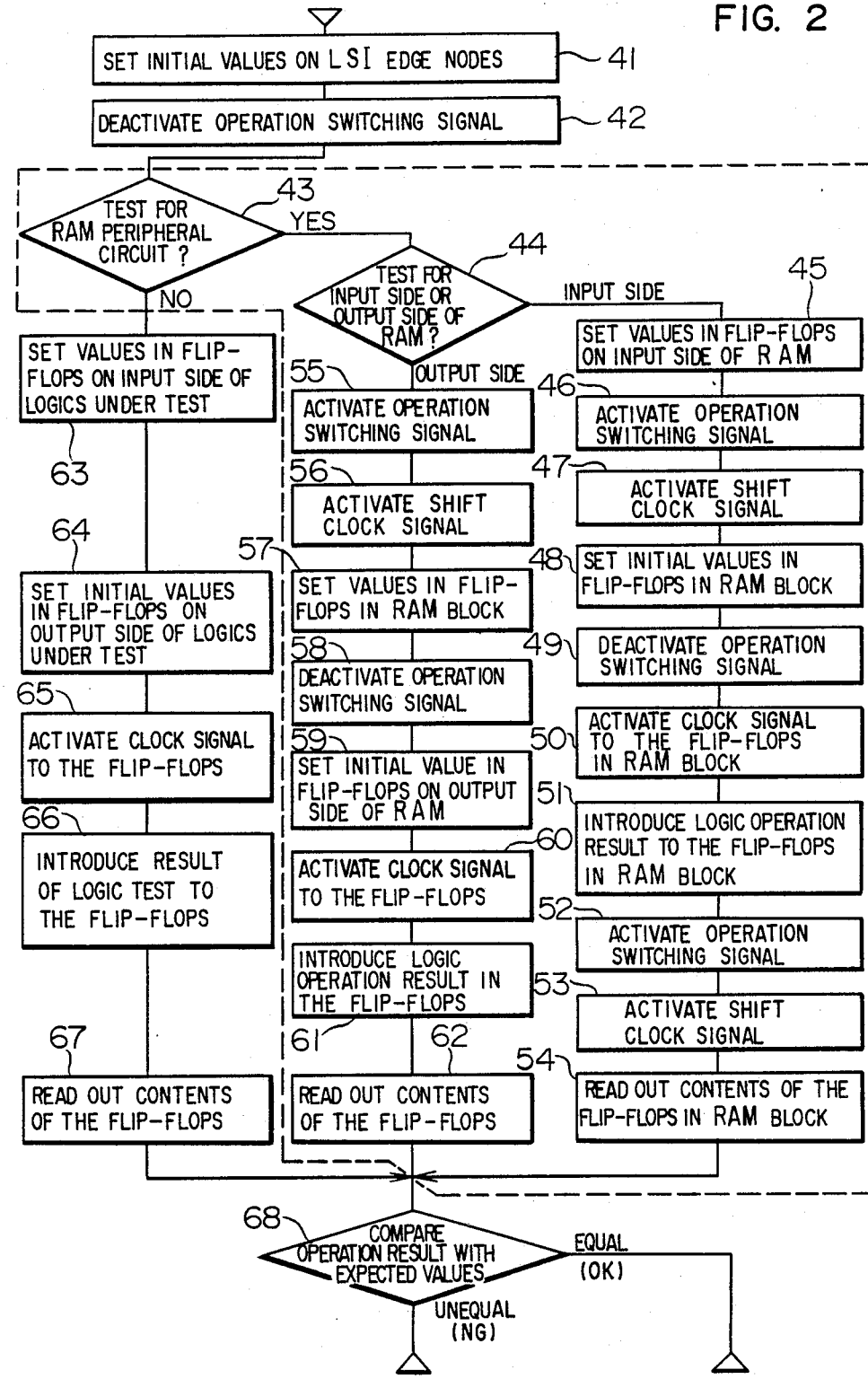
FIG. 2 is a flowchart showing, as an example, the sequence of test process according to this invention.

FIG. 2 shows in flowchart the sequence of test processes for various sections on the LSI chip. In the figure, steps 43 through 62 enclosed in the dashed block are portions which are newly added by the present invention. Case 1: Test for RAM front-stage logic circuit The test process includes steps 43, 44 and 45–54. Initially, the tester sets certain values in the flip-flops 19 located at the front end of the RAM frontstage logic circuit: (step 45). Next, the tester operates in shift mode to set initial values in the flip-flops 13 in RAM memory block located at the end of the RAM front-stage logic circuit: (steps 46–48). The tester operations in latch mode to store the result of logical operation by the RAM front-stage logic circuit for the values of flip-flops $19_1$–$19_3$ into the RAM block flip-flops $13_1$–$13_3$: (steps 49–51). Finally, the tester operates in shift mode again to read the contents of the RAM block flip-flops 13: (steps 52–54). The tester compares the readout result with the output expected values in the diagnostic data, and completes the test process for the RAM front-stage logic circuit. Case 2: Test for RAM rear-stage logic circuit The test process includes the steps 44 and 55–62. Initially, the tester operates in shift mode to set values in the flip-flops $20_1$–$20_3$ in RAM memory block located at the front end of the RAM rear-stage logic circuit using the line 15: (steps 55–57). Next, the tester operate in latch mode to set initial values in the RAM rear-stage flip-flop 22 located at the end of the RAM rear-stage logic circuit using the line 14: (steps 58–59). Next, the tester stores the result of logical operation by the RAM rear-stage logic circuit for the values of RAM block flip-flops $20_1$–$20_3$ into the RAM rear-stage flip-flops $22_1$–$22_3$: (steps 60–61). Finally, the tester operates on the scanning circuit 27 to read out the contents of the RAM rear-stage flip-flops $22_1$–$22_3$ over the line 29: (step 62). The tester compares the readout values with the output expected values in the diagnostic data, and completes the test process. Case 3: Test for random logic circuits unrelated to RAM The test process includes the steps 43 and 63–67, and these are identical to the conventional process. Initially, the tester sets values in the front-stage flip-flops of the logic circuit to be tested: (step 63). Next, the tester sets the initial values in the flip-flops of logic circuit under test: (step 64). The tester reads the result of operation by the logic circuit for the values set in the front-stage flip-flops: (steps 65–67). The tester compares the readout result with the output expected values in the diagnostic data, and completes the test process. The logic circuit section under test is not shown in FIG. 1.

Figure 3A:
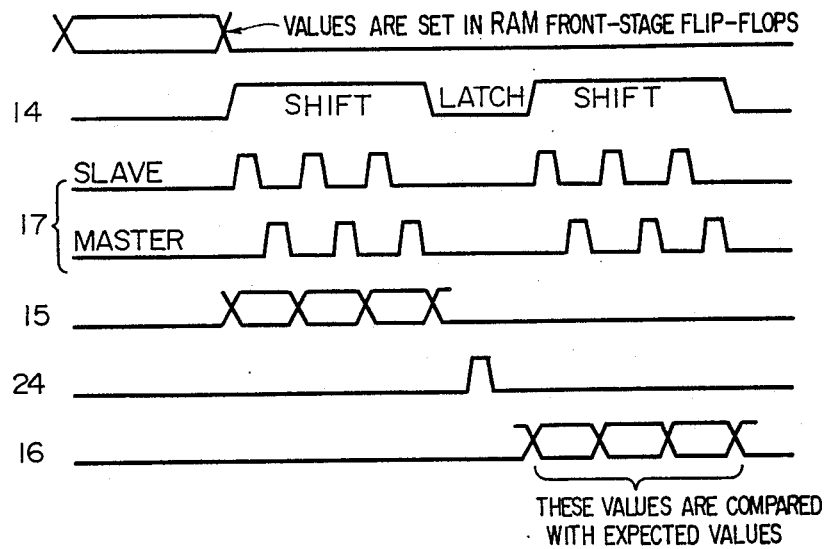
FIGS. 3a and 3b are timing charts for the major input/output signal lines used for the test.
Figure 3B:
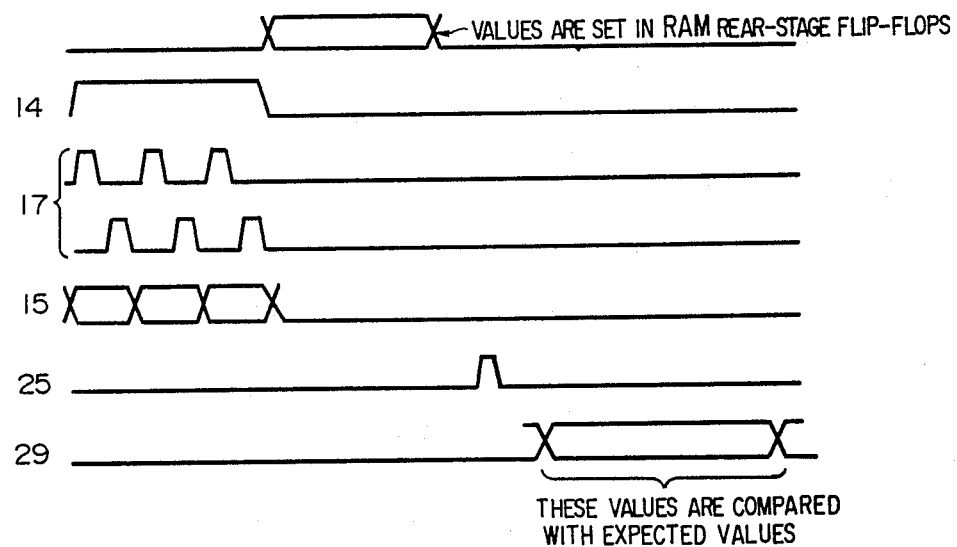

FIGS. 3A and 3B show on timing charts the input-/output signals during the test for the RAM frontstage and rear-stage logic circuits. (A) Test for RAM front-stage logic circuit (FIG. 3A)

Initially, values are set in the RAM frontstage stage flip-flops $19_1$–$19_3$. With the operation switching signal 14 being activated, a pulse signal is placed on two shift clock signal lines 17 alternately so that the RAM block flip-flops $13_1$–$13_3$ operate as a shift register, and initial values are set in them using the value setting signal line 15. Next, by activating the clock signal line 24 to select latch mode, the result of logical operation by the RAM front-stage logic circuit 18 for the values of RAM front-stage flip-flops $19_1$–$19_3$ is introduced to the RAM block flip-flops 13. Finally, the operation switching signal line 14 is activated again, with the shift clock signal line 16 being made active, the contents of the RAM block flip-flops $13_1$–$13_3$ are introduced to the tester, by which the contents are compared with the expected values, and the test process completes. (B) Test for RAM rear-stage logic circuit (FIG. 3B)

With the operation switching signal line 14 being activated, a pulse signal is placed on two shift clock signal lines 17 alternately so that the RAM block flip-flops 20 operate as a shift register, and values on the value setting signal line 15 are set in them. Next, initial values are set in the RAM rear-stage flip-flops $22_1$–$22_3$. Next, by activating the clock signal line 25, the result of logical operation by the RAM rear-stage logic circuit 21 for the values of RAM block flip-flops $20_1$–$20_3$ is introduced to the RAM rear-stage flip-flops $22_1$–$22_3$. Finally, the contents of the RAM rear-stage flip-flops $22_1$–$22_3$ are set over the scanout data line 29 to the tester, by which the contents are compared with the expected values, and the test process completes.

According to the foregoing embodiment of this invention for the diagnosis of LSI chips including memory blocks such as RAM and ROM, the peripheral logic circuitry of memory blocks can be tested independently of the memory blocks, and the defect detection rate for the whole LSI chip is effectively enhanced. In fact, the diagnosis of 20 K gate LSIs was conducted, and the improvement of defect detection rate by 5-10% was confirmed.

The conventional test methods, e.g., pingpong test method or Glap test method are used, and normally the diagnosis is conducted in RAM test mode specified with the edge/edge data wire selector.

Figure 4:
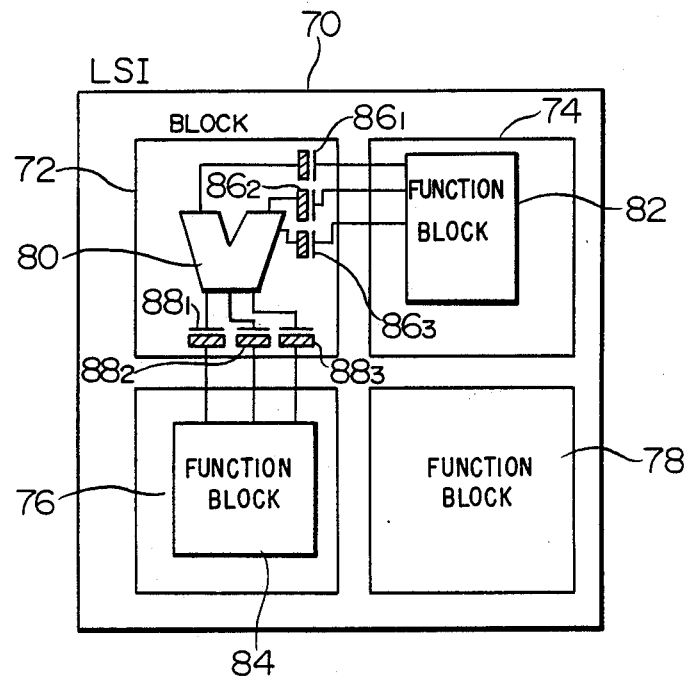
FIG. 4 is a block diagram showing another embodiment of this invention.

FIG. 4 shows another embodiment of this invention. In the figure, an LSI chip 70 comprises functional blocks 72, 74, 76 and 78 that are divided design units of LSI circuit, with mutual connections being made among the blocks. Among the blocks, the block 72 includes complex logic circuits such as an arithmetic unit 80, which is in mutual connection with logic circuits 82 and 84 in other blocks 74 and 76. Connected on the nodes for connecting the inputs and outputs of the logic circuits 80 and 82 are latch/shift registers $86_1$–$86_3$, such as flip-flops, which operate in test mode. The logic circuit 82 has its test output held in the latch/shift registers $86_1$–$86_3$, which then operate in shift mode to shift out the test output to the outside. Similarly, latch/shift registers $88_1$–$88_3$ are placed on the node for connecting the inputs and outputs of the logic circuits 80 and 84, with test values (bit pattern) being shifted-in from the outside, and a test bit pattern is supplied to the input of the logic circuit 84. The relation between the LSI 70 and the diagnostic system and the detailed arrangement of the testing circuit in the LSI 70 are identical to the embodiment of FIG. 1, and explanation thereof will be omitted. The embodiment of FIG. 4 eliminates the need of intricate condition setting to the arithmetic unit 80 at testing, and the LSI test process is simplified. Namely, the test result of the logic circuit 82 is available on the external pins (bonding bads), instead of being transferred through the arithmetic unit 80. For testing the logic circuit 84, a test bit pattern can be set directly from the latch/shift register $88_1$–$88_3$, instead of supplying it through the logic circuit 80 in other block.

We claim:

1. A testable LSI device comprising:
   input and output terminals for said device;
   a memory block;
   first and second peripheral logic blocks connected to input and output nodes of said memory block, respectively, said first peripheral logic block includes a scan-in circuit connected to said input terminal and a first combination logic circuit, said second peripheral logic block includes a scan-out circuit connected to said output terminal and a second combination logic circuit;
   said input and output nodes being provided by a plurality of series connected first latch components, and a plurality of series connected second latch components respectively, said series connected first latch components being on the input side of said memory block and said series connected second latch components being on the output side of said memory block, each of said series connected latch components being provided with
   means for performing a scanning function;
   first and second selectors provided on the input side of side of said series connected first latch components and the output side of said series connected second latch components, respectively, for selecting inputs of initializing signals to said series connected first latch components and outputs of test result values from said series connected second latch components when said first and second selectors are switched to a test mode;
   input latch means connected between said scan-in circuit and said first combination logic circuit and output latch means
   connected between said scan-out circuit and said second combination logic circuit
   for receiving, by scan address test values to be applied to said first combination logic circuit and for reading out, by scan address, test result values from said second combination logic circuit respectively;
   latch component control means for selectively activating a latch function and said scanning function of said series connected latch components;
   test signal means responsive to said latch component control means for inputting initializing signals to said series connected first latch components and for setting test values in said series connected second latch components; and
   wherein said latch control means provides a switching signal to said first and second selector causing said first and second selector to switch between the test mode and a normal operation mode.

2. A testable LSI device according to claim 1, wherein each of said series connected latch components comprise flip-flops connected in series to make up a shift register to perform the latch function and scanning function alternately.

3. A testable LSI device according to claim 1, wherein said first and second peripheral logic blocks are tested independently under control of said selector.

4. A method for testing a testable LSI device including input and output terminals for the device, a memory block, first and second peripheral logic blocks connected to input and output nodes of the memory block, respectively, said input and output nodes being provided by a plurality of series connected first latch components and a plurality of series connected second latch components respectively, comprising the steps of:
   independently testing said first peripheral logic block by inputting test values in input latch means, inputting initial values in said series connected first latch components, storing test result values of logical operations performed by said first peripheral logic block on said test values stored in said input latch means in said series connected first latch components, reading out said test result values from said series connected first latch components and comparing said test result values with predetermined expected values to determine whether defects exist within said first peripheral logic block; and
   independently testing said second peripheral logic block by inputting test values in said series connected second latch components, inputting initial values in output latch means, storing test result values of logical operations performed by said second peripheral logic block on said test values from said series connected second latch components in said output latch means, reading out said test result values from said output latch means and comparing said test result values with predetermined expected values to determine whether defects exist in said second peripheral logic blocks.

* * * * *